United States Patent [19]

Porter et al.

[11] Patent Number: 4,703,198

[45] Date of Patent: Oct. 27, 1987

[54] BI-DIRECTIONAL DATA TRANSFER CIRCUIT THAT IS DIRECTIONALLY RESPONSIVE TO THE IMPEDANCE CONDITION OF AN ASSOCIATED INPUT/OUTPUT PORT OF A MICROCOMPUTER

[75] Inventors: Frederick J. Porter, Farmington Hills; Richard A. Pidsosny, Canton, both of Mich.

[73] Assignee: Ford Motor Company, Dearborn, Mich.

[21] Appl. No.: 883,264

[22] Filed: Jul. 7, 1986

[51] Int. Cl.$^4$ ............ H03K 19/017; H03K 19/094; H03K 17/04; H03K 17/687

[52] U.S. Cl. .................................. 307/473; 307/443; 307/446; 307/475; 307/571

[58] Field of Search ............ 307/475, 448, 584, 571, 307/572, 577, 581, 440, 299 R, 239, 450, 443, 200 B, 446, 473; 365/194, 203

[56] References Cited

U.S. PATENT DOCUMENTS

| | | | |
|---|---|---|---|
| 3,769,525 | 10/1973 | Foss et al. | 307/254 |
| 3,780,316 | 12/1973 | Wilhelm | 307/254 |
| 3,935,476 | 1/1976 | Paluck | 307/303 |
| 4,000,429 | 12/1976 | Yoshida et al. | 307/246 |
| 4,150,438 | 4/1979 | Dorey et al. | 364/900 |
| 4,166,963 | 9/1979 | Metcalf | 307/264 |
| 4,282,447 | 8/1981 | Summers et al. | 307/255 |
| 4,315,167 | 2/1982 | Pelc | 307/241 |
| 4,410,814 | 10/1983 | Duijkers | 307/475 |
| 4,471,243 | 9/1984 | Isham | 307/475 |
| 4,479,067 | 10/1984 | Fujita | 307/581 X |

FOREIGN PATENT DOCUMENTS

| | | | |
|---|---|---|---|
| 1463626 | 5/1974 | United Kingdom | 307/475 |
| 1467726 | 5/1974 | United Kingdom | 307/475 |

Primary Examiner—Stanley D. Miller
Assistant Examiner—David R. Bertelson
Attorney, Agent, or Firm—Paul K. Godwin, Jr.; Clifford L. Sadler

[57] ABSTRACT

A bi-directional interface circuit which functions as an output driver to drive a corresponding communication data bus in response to the output of an associated microcomputer and as an input buffer to communicate data from the associated data bus to the microcomputer, wherein such input and output data to and from the microcomputer is communicated to a single port on the microcomputer. The bi-directional interface circuit is controlled by sensing the impedance condition existing on the input/output port of the microcomputer and correspondingly switches to either its output driver mode or input buffer mode.

5 Claims, 3 Drawing Figures

BI-DIRECTIONAL DATA TRANSFER CIRCUIT THAT IS DIRECTIONALLY RESPONSIVE TO THE IMPEDANCE CONDITION OF AN ASSOCIATED INPUT/OUTPUT PORT OF A MICROCOMPUTER

BACKGROUND OF THE INVENTION

1. Field of the Invention

The present invention is directed to the field of digital data communication and more specifically to the area involving circuitry that functions as a buffer between input/output ports of microcomputers and associated data links.

2. Description of the Prior Art

Many microcomputer applications require external interface circuits to protect the microcomputer or enhance its drive capabilities by supplying the currents and voltages necessary to provide output to an associated data communication bus. Prior art interface circuits are typically designed to drive an associated external data bus in response to the data signals output from the microcomputer or to receive input date from the associated data communication bus and supply that data to the microcomputer.

A typical bi-directional interface circuit is shown in U.S. Pat. No. 4,471,243 which utilizes a single bi-directional data bus connection between the microprocessor and the external interface circuit. In addition, that interface circuit is connected to the microprocessor via two other control lines in which the microprocessor provides control signals to the interface circuit. The control signals set the interface circuit in either a receive or transmit mode so that data may be respectively received from an external source and conveyed to the microprocessor or transmitted by the microprocessor to the external load.

U.S. Pat. No. 3,769,525 to Foss et al is directed to an external bi-directional amplifying circuit which also uses a control line in addition to the bi-directional data line in order to control the functional gating of the circuit.

SUMMARY OF THE INVENTION

In the present invention, a bi-directional interface circuit is provided which functions as an output driver to drive a corresponding communication data bus in response to the output of an associated microcomputer and as an input buffer to communicate data from the associated data bus to the microcomputer, wherein such input and output data to and from the microcomputer is communicated to a single port on the microcomputer. The bi-directional interface circuit does not require additional connections to the microcomputer by way of control lines, but rather, senses the impedance condition existing on the input/output port of the microcomputer and correspondingly switches to either its output driver mode or input buffer mode.

Generally, the input/output ports of a microcomputer are internally controlled by the microcomputer to exhibit one of three states. In its output mode, the input/output port is switched between and low impedance current sourcing state and a low impedance current sinking state. In its input mode, the input/output port is held at a high impedance state. The bi-directional interface circuit of the present invention appropriately senses the impedance states of the microcomputer input/output port and responsively switches to its corresponding output driver state or input buffer state.

It is therefore an object of the present invention to provide a self-switching input/output interface circuit which solely responds to the impedance condition and voltage levels present on the input/output port of a corresponding microcomputer.

It is another object of the present invention to provide a bi-directional interface circuit which does not require data direction control lines interconnected between the interface circuit and the associated microcomputer and thereby allows for additional input/output ports to be provided on a microcomputer which utilizes a standard number of pins in a standard package size.

It is a further object of the present invention to provide a bi-directional interface circuit which utilizes common components in both its output driver state and its input buffer state.

BRIEF DESCRIPTION OF THE DRAWINGS

FIG. 3 is a schematic diagram of a preferred embodiment of the present invention connected between an associated microcomputer and a communication data bus.

DETAILED DESCRIPTION OF A PREFERRED EMBODIMENT

Figure 1:
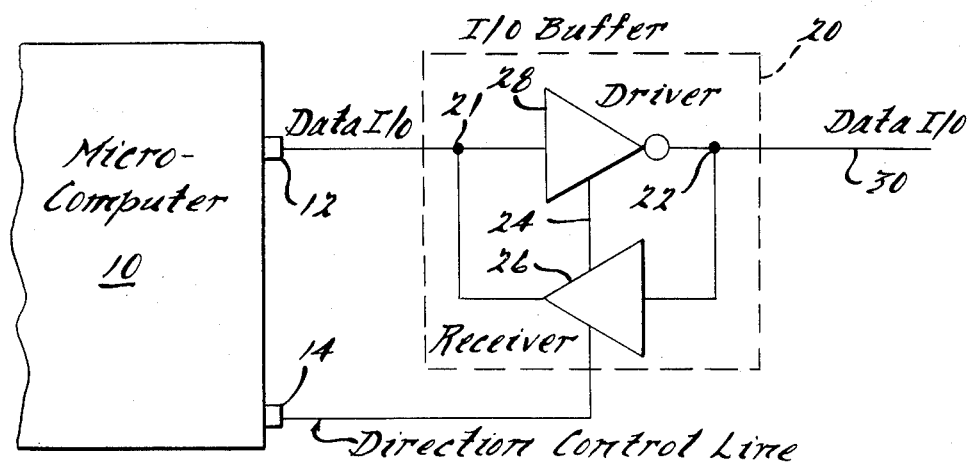
FIG. 1 is a block diagram of a typical prior art input/output interface circuit utilizing a direction control line in addition to the input/output data line connections to its associated microcomputer.

In FIG. 1, a block diagram is illustrated which depicts a typical prior art input/output interface buffer circuit 20. That circuit 20 is shown as having a connection made to a microcomputer 10 at one of its input/output data ports 12 and another connection to a direction control line at a port 14. The microcomputer 10 therefore dedicates two ports to the input/output buffer circuit 20. It provides a bi-level indication on the direction control line connected to port 14 to control which direction data will be flowing through the buffer circuit 20. Internal to the buffer circuit 20, an inverting driver circuit 28 is illustrated and a receiver circuit 26 is shown connected so as to bypass the driver circuit 28. The direction control line from the port 14 on the microcomputer 10 is illustrated as being interconnected between the receiver and the driver via line 22. It is logically controlled to enable the driver circuit 28 while disabling receiver circuit 26 or in the alternative enable the receiver 26 and disable the driver 28. The prior art circuit shown in FIG. 1 functions quite similar to the device shown in FIG. 2 of the U.S. Pat. No. 3,769,525, described above.

It can be seen, by referring to FIG. 1, that in each instance where data is input to or output from a microcomputer 10 through a conventional bi-directional input/output buffer circuit at least two lines are employed to obtain the serial flow of data between the microcomputer 10 and a data bus 30 or any other utilization device located at the remote end of the circuit 20. In normal operation of the prior art system, the microcomputer provides the proper gating signal to the direction control line when data is to be output from the microcomputer. By placing the appropriate gating signal on the port 14, microcomputer 10 effectively enables the driver 28 to then transfer the binary data output on port 12 to the communication data bus 30. When the microcomputer 10 is configured to receive data on its port 12, from the communication data bus 30 the receiver 26 is enabled and the driver 28 is disabled.

Integrated circuits are fairly well standardized in packaging size and pin numbers corresponding to the package sizes, to facilitate corresponding standardization of sockets and other mounting devices. Applicants have appreciated that it is highly desirable to maximize the number of input/output data ports on a microprocessor while utilizing the standard number of pins in a given package size. The present invention overcomes the necessity of using a control direction line by sensing the impedance level on the input/output data port of the microprocessor and appropriately switching to a bi-level driver state in one instance and a resistive receiver state in a second instance.

Figure 2:
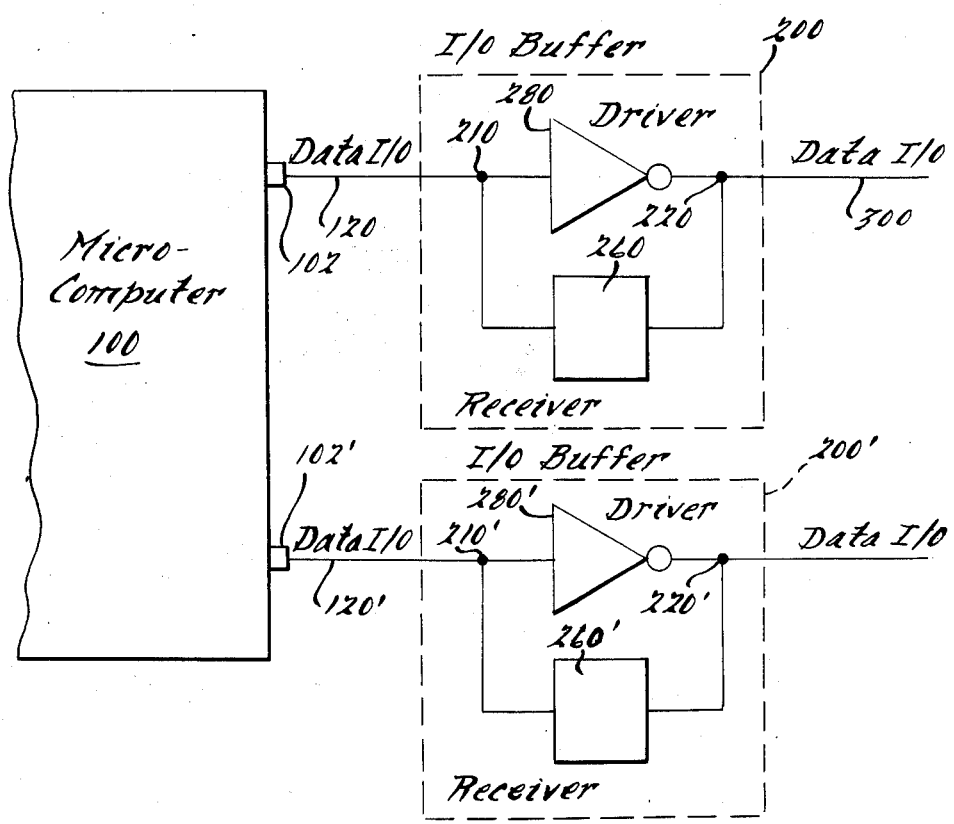
FIG. 2 is a block diagram of the present invention which allows for additional input/output data lines to be incorporated in an associated microcomputer by providing an input/output interface circuit which does not require the use of a separate direction control line.
Figure 2:
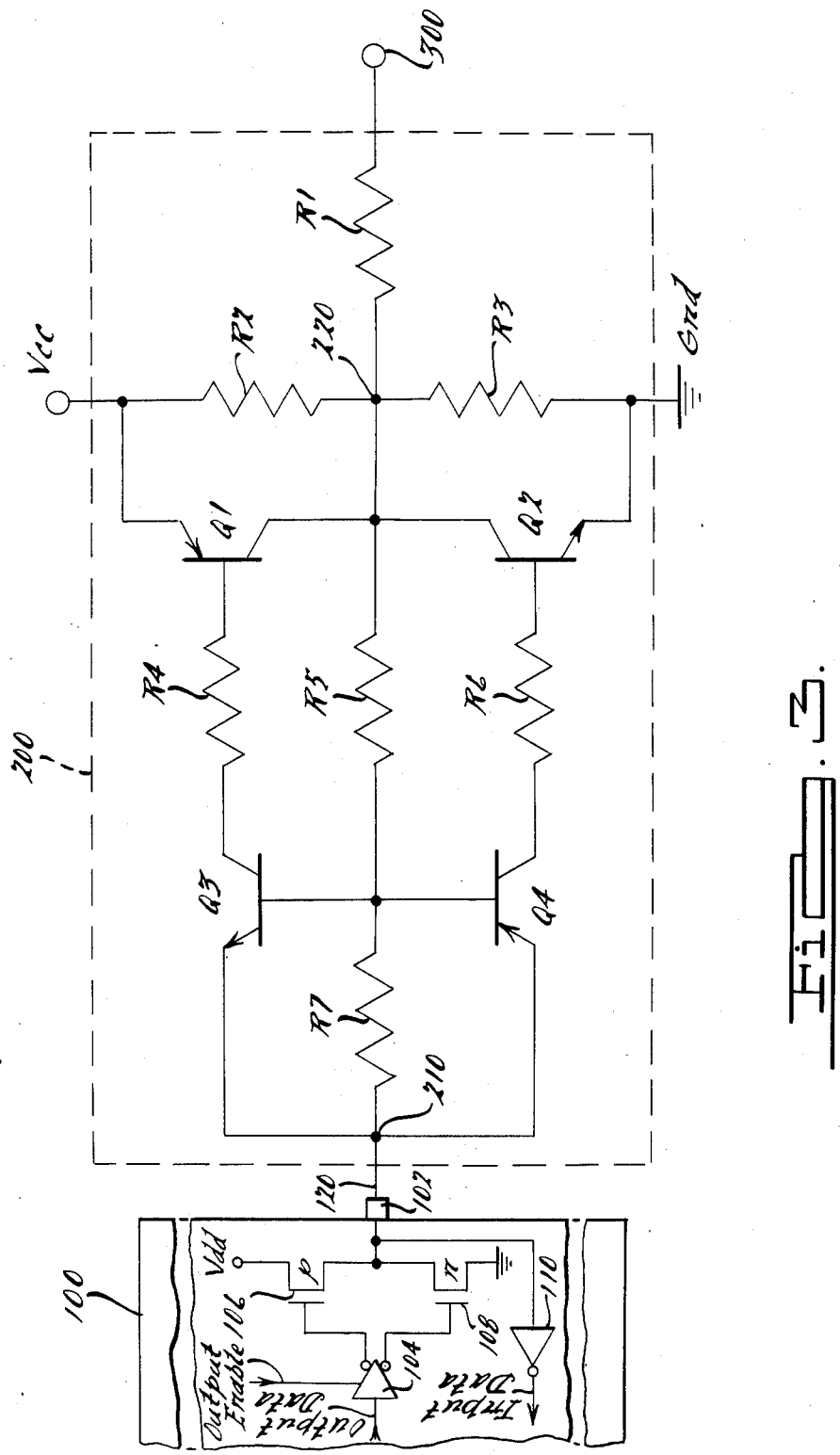

FIG. 2 is a block diagram of the subject invention which illustrates that the two terminals in a microprocessor package normally dedicated in the prior art to control one input/output buffer circuit may now both be utilized to provide the appropriate gating of data in and out of the microcomputer 10. In this manner twice as much data may be transferred into and out of the microcomputer by utilizing the two ports to respectively drive separate input/output buffer circuits.

In the FIG. 2 drawing, a microcomputer 100 has input/output data ports 102 and 102' which are controlled internal to the microcomputer to either receive data and assume a high impedance state or to output data at a low impedance state. In the transmit mode, the data is supplied by the microcomputer 100 on its input/output data port 102 as a binary logic level signal in which the port is switched between a low impedance current source and a low impedance current sink (a low impedance relatively high voltage level and a low impedance relatively low voltage level - ground). In that low impedance state, the driver 280 provides an inverted output level signal to its output junction 220 which is electrically connected to a data communication bus 300 (or a another microcomputer or utilization device). In the receive mode the microcomputer 100 sets the input/output data port 102 to a high impedance and the driver portion 280 is disabled. Resistive network 260 provides any input data from the data communication bus 300 directly to the input/output data port 102 on line 120. The bi-directional input/output buffer circuit 200' shown connected to input/output data port 102' functions in an identical manner.

FIG. 3 provides a diagram of a preferred embodiment of the present invention. In addition, a typical input/output impedance control circuit for a microprocessor is shown connected to input/output data port 102.

With respect to the bi-directional circuit 200, interconnections are made between an external regulated voltage supply $V_{cc}$ (on the order of 5 volts D.C.) and ground. A PNP switching transistor $Q_1$ is shown with its emitter connected to $V_{cc}$. An NPN switching transistor $Q_2$ is shown with its emitter connected to ground. The collectors of $Q_1$ and $Q_2$ are commonly at junction 220. Voltage divider resistors $R_2$ and $R_3$ are respectively connected between the emitter and collector of transistors $Q_1$ and $Q_2$. Resistors $R_2$ and $R_3$ are equal in value and are also connected to junction 220. NPN control transistor $Q_3$ is provided with its collector connected to a resistor $R_4$, which in turn is connected to the base of $Q_1$. PNP control transistor $Q_4$ is provided with its collector connected to resistor $R_6$ which is in turn connected to the base of $Q_2$. The bases and emitters of $Q_3$ and $Q_4$ are separate but commonly connected to provide control switching of the switching transistors $Q_1$ and $Q_2$ respectively. A resistor $R_7$ extends between the common connection of the bases of $Q_3$ and $Q_4$ to the common connection of the emitters of $Q_3$ and $Q_4$. The common connection of the emitters of $Q_3$ and $Q_4$ and one end of resistor $R_7$ is designated as the junction 210 of the circuit 200 and is electrically connected through a wire lead 120 to the input/output data port 102 of the microcomputer 100.

Resistor $R_1$ is connected between the junction 220 of the resistors $R_2$ and $R_3$ and the data communication bus 300. The value of $R_1$ is selected in this embodiment to be approximately 1/10 the value of $R_2$. A resistor $R_5$ is provided between the junction 220 and the common base connections of $Q_3$ and $Q_4$ in order to isolate the common transistor connections. Resistors $R_1$, $R_5$ and $R_7$ form the receiver network 260 but also function as a part of the driver 280.

Within the microcomputer 100, a pair of "p" and "n" channel devices 106 and 108 are serially connected between a voltage or current source $V_{dd}$ and ground. The common connection between the devices 106 and 108 is connected to the input/output data port 102. The gates of the channel devices 106 and 108 are connected to separate inverted outputs of an inverter 104 in which output transmission data is provided in a binary format.

When the output enable line is held at a high "1" level the inverter 104 is enabled to pass binary data to the devices 106 and 108 in the form of exclusive OR logic. Depending upon the logic levels present at the outputs of inverter 104, gate 106 or gate 108 is exclusively biased to a low impedance state to correspondingly provide the $V_{dd}$ level or the ground level to the input/output port 102 and thereby transmit binary data.

When the output enable logic is provided to the inverter 104 at a low "0" level in order to receive data, both gated devices 106 and 108 are switched to high impedance states. A parallel connected input inverter 110 has a constant high input impedance and the input/output port 102 is therefore at a high impedance state to receive data.

In the transmit mode of operation and with the output enable at a "1" level, when the microcomputer 100 provides output data of a "1" logic level to inverter 104, a relatively low voltage level "0" is provided to the gates of devices 106 and 108. A relatively low level at the gate of device 106 enables that device to provide a low impedance current source, to the input/output port 102 while holding device 108 disabled. Current from the $V_{dd}$ source flows out of the input/output port 102 through the lead line 120 and into the junction 210. Current flows through the resistor $R_7$, the resistor $R_5$ and $R_3$ to ground. Voltage dropped across resistor $R_7$ forward biases the base-emitter junction of transistor $Q_4$ and reverse biases the base-emitter junction of transistor $Q_3$. The forward biased transistor $Q_4$ causes the transistor $Q_2$ to also be forward biased and thereby provide a low impedance path between the junction 220 and ground. Consequently, with $Q_2$ turned "ON" the voltage level provided at the data communication bus 300 is also at a relatively low level, approximating ground, and corresponds inversely to the output data logic level received at inverter 104 in the microprocessor 100.

When the output data signal level present at the input of inverter 104 switches to a "0" level, the output of inverter 104 switches to a "1" level and the gate 108 is enabled while the gate 106 is disabled. Therefore, a low impedance current sink is provided at the input/output data port 102 so that instantaneously, $Q_4$ is no longer forward biased and $Q_2$ is switched to a high impedance state. Current, provided by voltage source $V_{cc}$, then flows through resistor $R_5$ and $R_7$ into the input/output data port 102 to ground through the channel gate device 108. The voltage dropped across $R_7$ causes the transistor $Q_4$ to be held in a reversed biased condition and the transistor $Q_3$ to be forward biased. The forward biased transistor $Q_3$ causes the switching transistor $Q_1$ to be forward biased and switched to a low impedance state. The low impedance path provided between the junction 220 and $V_{cc}$ due to the transistor $Q_1$ being switched "ON" places a relatively high voltage level (approximating $V_{cc}$) at junction 220 and the communication data bus 300.

In the described embodiment, $Q_1$ and $Q_2$ are switched "ON" to their low impedance states in the alternative and exclusive of each other are never in their low impedance states at the same time. Therefore, a current limiting resistor is not required between the collectors of $Q_1$ and $Q_2$. This allows for lower minimum logic "0" levels and higher maximum logic "1" levels to be output from the circuit.

When the input/output port 102 on the microcomputer 100 is at a high impedance state, the microcomputer is acting as a receiver of data from the communication data bus 300. In that instance, transistors $Q_1$, $Q_2$, $Q_3$ and $Q_4$ are all biased in an "OFF" condition and any incoming data received from the bus 300 is communicated across the resistors $R_1$, $R_5$ and $R_7$ to the inverter 110 of the microcomputer 100.

Since the voltage level at junction 220 is $V_{cc}/2$ and the expected "1" logic level from the data communication bus is at the $V_{cc}$ level, input "1" logic across the low value resistor $R_1$ raises the voltage level at junction 220 to approximately $V_{cc}$ with the majority of the voltage being dropped across resistor $R_3$ to ground. Since relatively insignificant current flows in resistors $R_5$ and $R_7$, due to the high impedance at the input/output port 102, the logic "1" level of $V_{cc}$ is felt at the inverter 110.

When a logic "0" level is received from communication data bus 300, the voltage level at junction 220 is substantially close to "0" due to the low value of $R_1$, compared to the value of $R_2$. The total $V_{cc}$ voltage level is dropped across $R_2$ and the "0" voltage level is present at the input of inverter 110.

The following table lists the values of the resistors employed in the preferred embodiment described above. It should be further pointed out that the value of $V_{cc}$ and $V_{dd}$ in this embodiment are approximately 5 volts.

$R_1 = 470$
$R_2 = R_3 = 10K$
$R_4 = R_6 = 10K$
$R_5 = 220$
$R_7 = 1K$

It will be apparent that many modifications and variations may be implemented without departing from the scope of the novel concept of this invention. Therefore, it is intended by the appended claims to cover all such modifications and variations which fall within the true spirit and scope of the invention.

We claim:

1. An impedance sensing circuit for connection to an input/output port of a microcomputer to provide bi-directional data transfer between the input/output port and an associated data bus, comprising:

means coupled to said input/output port for providing a low impedance and relatively low voltage level condition on said input/output port to provide a relatively high voltage level output to said associated data bus and actively responsive to a low impedance and relatively high voltage level condition on said input/output port to provide a relatively low voltage level output to said associated data bus; and means coupled to said input/output port for providing passively responsive to a high impedance condition on said input/output port to communicate relatively high and relatively low voltage levels from said associated data bus to said port.

2. A circuit as in claim 1, wherein said low impedance providing means includes a first switching means connected between a relatively high voltage source and said data bus and a second switching means connected between a ground potential and said data bus, said first and second switching means are commonly connected to said input/output port of said microcomputer, whereby said first switching means responds to a low impedance and relatively low voltage level condition of said port to provide said relatively high voltage from said source to said data bus and said second switching means responds to a low impedance and relatively high voltage level condition at said port to provide a ground level connection to said data bus.

3. A circuit as in claim 2, wherein said high impedance providing means includes a resistive network, between said output node and said input/output port, that is common to both said first and second switching means.

4. Circuit that functions to provide a dual function of an output driver and a resistive input buffer between a serial data transfer input/output port of a microcomputer and a communication bus, wherein each function is solely dictated by the impedance level placed on said input/output port by said microcomputer, said circuit comprises:

a first switching means connected to said input/output port, said communication bus and a source of DC voltage to sense the condition of said input/output port and responsively provide an electrical connection between said communication bus and said source of DC voltage only when said input/output port is sensed as being in a low impedance condition and at a relatively low voltage level;

second switching means connected to said input/output port, said communication bus and ground level to sense the condition of said input/output port and responsively provide an electrical connection between said communication bus and ground only when said input/output port is sensed as being at a low impedance condition and at a relatively high voltage level; and said first and second switching means have common passive resistive elements which function to provide electrical connection between said input/output port and said communication bus when said input/output port is at a high impedance condition.

5. An impedance sensing circuit for connection to an input/output port of a microcomputer to provide bi-directional data transfer between the input/output port and an associated data bus, comprising:
  means coupled to said input/output port for providing a low impedance condition on said input/output port to convey data from said input/output port to said associated data bus; and
  means coupled to said input/output port for providing a high impedance condition on said input/output port to convey data from said associated data bus to said input/output port.

* * * * *